(12) United States Patent
Kim et al.

(10) Patent No.: US 11,528,019 B2
(45) Date of Patent: Dec. 13, 2022

(54) FREQUENCY GENERATOR AND METHOD OF CALIBRATING FREQUENCY THEREOF

(71) Applicant: LX SEMICON CO., LTD., Daejeon (KR)

(72) Inventors: Kyu Ho Kim, Daejeon (KR); Dong Gil Jeong, Daejeon (KR); Ho Yul Choi, Daejeon (KR); Won Joon Hwang, Daejeon (KR); Tae Woo Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/454,136

(22) Filed: Nov. 9, 2021

(65) Prior Publication Data
US 2022/0149824 A1 May 12, 2022

(30) Foreign Application Priority Data
Nov. 12, 2020 (KR) .................. 10-2020-0150936

(51) Int. Cl.
*H03K 5/00* (2006.01)
*H03K 3/037* (2006.01)

(52) U.S. Cl.
CPC ........ *H03K 5/00006* (2013.01); *H03K 3/037* (2013.01)

(58) Field of Classification Search
CPC . H03L 7/18; H03L 7/099; H03L 7/085; H03L 7/093; H03L 7/08; H03L 7/0995; H03L 7/16; H03L 1/026; H03L 7/23; H03L 7/0992; H03L 7/091; H03L 7/113; H03L 7/07; H03L 2207/50; H03L 7/087; H03L 7/06; H03L 1/022; H03L 7/183; H03L 7/181; H03L 7/10; H03L 2207/06; H03L 7/1976; H03K 5/00006; H03K 3/037

See application file for complete search history.

(56) References Cited

U.S. PATENT DOCUMENTS

| | | | | |
|---|---|---|---|---|
| 2019/0036537 A1* | 1/2019 | Dorner | .................... | H03L 7/091 |
| 2019/0356320 A1* | 11/2019 | Seo | .......... | H03L 1/028 |
| 2019/0356324 A1* | 11/2019 | Jenkins | ................. | H03L 7/1972 |
| 2020/0091922 A1* | 3/2020 | Jany | ........................... | H03L 7/06 |
| 2020/0136629 A1* | 4/2020 | Kirschner | ............... | H03L 7/093 |

FOREIGN PATENT DOCUMENTS

| | | |
|---|---|---|
| KR | 10-1517389 B1 | 5/2015 |
| KR | 10-2016-0006501 A | 1/2016 |
| KR | 10-1651263 B1 | 8/2016 |
| KR | 10-2016-0104265 A | 9/2016 |

* cited by examiner

*Primary Examiner* — John W Poos
(74) *Attorney, Agent, or Firm* — Harness, Dickey & Pierce, P.L.C.

(57) ABSTRACT

Disclosed herein are a frequency generator, which is provided with a frequency automatic correction function and is capable of reducing a frequency test time and a correction time, and a method of correcting a frequency thereof. The frequency generator includes an oscillator configured to generate an output frequency signal according to a frequency control signal, and a frequency corrector configured to generate the frequency control signal for controlling the output frequency of the oscillator using a reference frequency signal.

19 Claims, 7 Drawing Sheets

FREQUENCY GENERATOR AND METHOD OF CALIBRATING FREQUENCY THEREOF

CROSS-REFERENCE TO RELATED APPLICATIONS

This application claims the benefit of the Korean Patent Application No. 10-2020-0150936 filed on Nov. 12, 2020, which are hereby incorporated by reference as if fully set forth herein.

FIELD

The present disclosure relates to a frequency generator, which is provided with a frequency automatic correction function and is capable of reducing a frequency test time and a correction time, a method of correcting a frequency thereof.

BACKGROUND

All electronic devices include an oscillator which is a circuit for generating a frequency signal. For example, the oscillator embedded in the electronic device generates a clock signal of a set frequency, and the electronic device operates on the basis of the clock signal of the oscillator. The oscillator should generate an accurate and stable frequency signal for reliability of the corresponding electronic device.

However, since frequency generation integrated circuits (ICs) or ICs having built-in frequency generation circuits have output frequency deviations due to semiconductor process variations, a frequency test time and a correction time for correcting output frequencies of the ICs according to target frequencies are necessary for shipment.

To this end, a method according to the related art is used such that an output frequency of a frequency generation IC is measured using a separate frequency measuring instrument, and a frequency control signal for adjusting the output frequency is generated from a personal computer (PC) or a measuring instrument so as to allow the measured output frequency from the frequency generation IC to come to a target frequency, and the frequency control signal is stored in an internal memory of the frequency generation IC.

However, the method according to the related art has a problem in that a separate frequency measuring instrument and a PC are required, and due to a communication time between the frequency generation IC, the frequency measuring instrument, and the PC, a measurement time required to obtain an accurate measurement frequency, and a time for frequency stabilization when controlling the frequency, measuring and correcting the frequency takes a long time.

SUMMARY

Therefore, according to the present disclosure, there are provided a frequency generator, which is provided with a frequency automatic correction function and is capable of reducing a frequency test time and a correction time, and a method of correcting a frequency thereof.

According to an aspect of the present disclosure, there is provided a frequency generator including an oscillator configured to generate an output frequency signal according to a frequency control signal, and a frequency corrector configured to generate the frequency control signal for controlling the output frequency of the oscillator using a reference frequency signal.

During a count-on period determined according to a first count value obtained by counting a first frequency signal which is any one of the output frequency signal of the oscillator and the reference frequency signal, the frequency corrector may count a second frequency signal which is the other one of the output frequency signal and the reference frequency signal to generate a second count value and generates the frequency control signal for controlling the output frequency of the oscillator according to the second count value.

The frequency corrector sequentially may perform a search mode for controlling the output frequency of the oscillator so as to allow the second count value to be present between a first reference value and a second reference value, and a tracking mode for minutely controlling the controlled output frequency of the oscillator so as to allow the second count value to be present between a third reference value and a fourth reference value.

In the search mode, the frequency corrector may generate a first frequency control signal for increasing, decreasing, or maintaining the output frequency of the oscillator according to a result obtained by comparing the second count value, which is generated during a first count-on period using the output frequency signal of the oscillator and the reference frequency signal, with the first reference value and the second reference value.

In the tracking mode, the frequency corrector may generate a second frequency control signal for minutely controlling the output frequency of the oscillator to be equal to the reference frequency according to a result obtained by comparing the second count value, which is generated during a second count-on period using the reference frequency signal and the output frequency signal of the oscillator generated according to the first frequency control signal, with the third reference value and the fourth reference value.

According to another aspect of the present disclosure, there is provided a method of correcting a frequency of a frequency generator, which includes a first operation of counting, by a frequency corrector, a first frequency signal which is any one of an output frequency signal of an oscillator and a reference frequency signal and determining a count-on period using any one of count values, and during the count-on period, a second operation of counting a second frequency signal which is the other one of the output frequency signal and the reference frequency signal and outputting a second count value, a third operation of generating a frequency control signal for controlling an output frequency of the oscillator according to the second count value, and a fourth operation of repeating the first to third operations to store the generated frequency control signal in a memory when the output frequency of the oscillator becomes equal to the reference frequency.

The method may further comprise an operation of sequentially performing a search mode for repeating the first to third operations and controlling the output frequency of the oscillator so as to allow the second count value to be present between a first reference value and a second reference value, and after the search mode, a tracking mode for repeating the first to third operations and minutely controlling the controlled output frequency of the oscillator so as to allow the second count value to be present between a third reference value and a fourth reference value.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
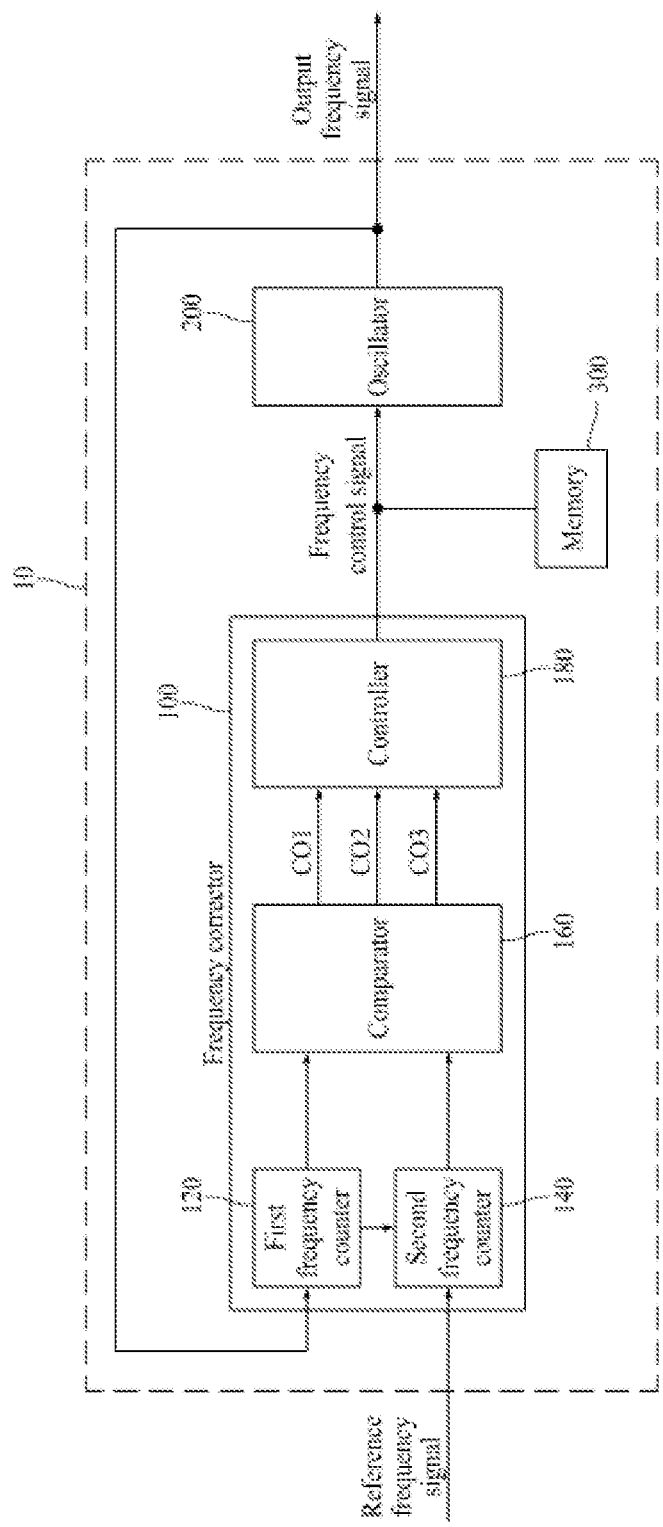
FIG. 1 is a block diagram illustrating a frequency generator according to one embodiment.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described with reference to the accompanying drawings.

Figure 2:
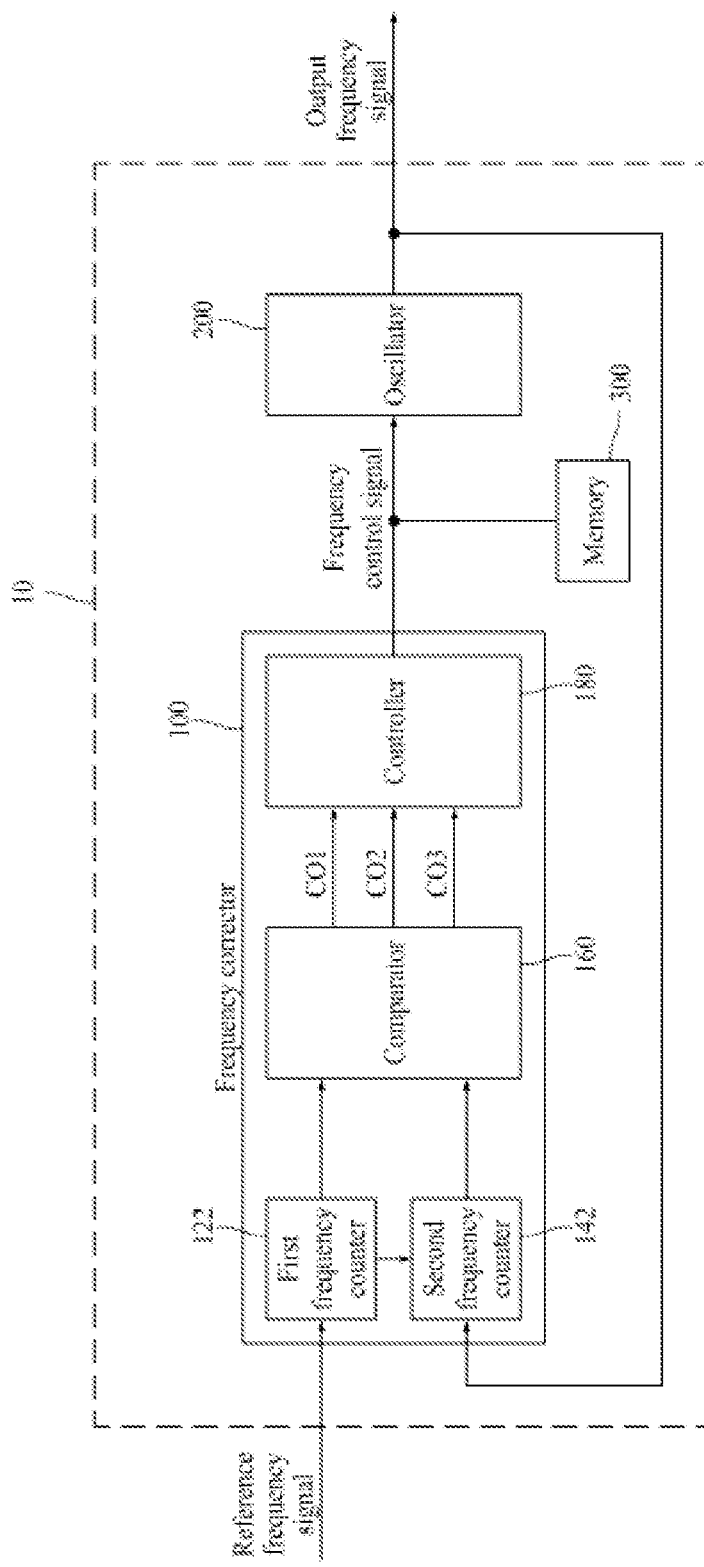
FIG. 2 is a block diagram illustrating a frequency generator according to one embodiment.

Each of FIGS. 1 and 2 is a block diagram illustrating a frequency generator according to one embodiment.

Referring to FIGS. 1 and 2, a frequency generator 10 includes a frequency corrector 100, an oscillator 200, and a memory 300.

The frequency generator 10 may perform a frequency correction function on the frequency corrector 100 through an on/off operation.

The frequency generator 10 may operate in a frequency correction mode for turning the frequency corrector 100 on to control an output frequency of the oscillator 200. The frequency corrector 100 generates a frequency control signal for controlling an output frequency of the oscillator 200 using a reference frequency applied externally or internally and stores the generated frequency control signal in the memory 300. The oscillator 200 may control the output frequency according to the frequency control signal output from the frequency corrector 100.

The frequency generator 10 may turn the frequency corrector 100 off, and the oscillator 200 may generate and output an output frequency signal having a frequency oscillating according to the frequency control signal stored in the memory 300. For example, the oscillator 200 may generate and output a clock signal having a frequency according to the frequency control signal.

The frequency generator 10 may perform a frequency correction function through an on/off operation on the frequency corrector 100 to reduce a frequency test time and a correction time for correcting the output frequency to be equal to a reference frequency.

The oscillator 200 generates a reference voltage using the frequency control signal and generates the output frequency signal using the reference voltage. When the reference voltage is increased according to the frequency control signal, the oscillator 200 may increase the output frequency, and when the reference voltage is decreased, the oscillator 200 may decrease the output frequency.

In the frequency correction mode, the frequency corrector 100 determines whether a frequency of the output frequency signal is lower, higher than, or equal to a frequency of the reference frequency signal using the output frequency of the oscillator 200 and the reference frequency applied internally or externally, and according to the determination result, the frequency corrector 100 generates a frequency control signal for controlling the output frequency to be equal to the reference frequency.

During at least a part of each measurement period (a count-on time) in which a first frequency signal of any one of the output frequency signal of the oscillator 200 and the reference frequency signal is counted by a setting value, the frequency corrector 100 may determine whether a frequency of the output frequency signal is lower, higher than, or equal to a frequency of the reference frequency signal using a value obtained by counting a second frequency of the other one of the output frequency signal and the reference frequency signal of the oscillator 200. According to the determination result, the frequency corrector 100 may generate a frequency control signal for controlling (increasing, decreasing, or maintaining) the output frequency of the oscillator 200.

The frequency corrector 100 may sequentially perform a search mode in which the output frequency of the oscillator 200 is adjusted within an allowable range with respect to the reference frequency and a tracking mode in which the output frequency of the oscillator 200 is finely adjusted within the allowable range, thereby quickly and precisely correcting the output frequency of the oscillator 200 to be equal to the reference frequency.

When the output frequency of the oscillator 200 becomes equal to the reference frequency, the frequency corrector 100 terminates the frequency correction operation and stores the generated frequency control signal in the memory 300.

Referring to FIGS. 1 and 2, the frequency corrector 100 may include a first frequency counter 120 or 122, a second frequency counter 140 or 142, a comparator 160, and a controller 180.

The first frequency counter 120 or 122 may count the first frequency signal which is one of the output frequency signal of the oscillator 200 and the reference frequency signal applied externally, and the second frequency counter 140 or 142 may count the second frequency signal which is the other one of the output frequency signal of the oscillator 200 and the reference frequency signal applied externally.

For example, the first frequency counter 120 shown in FIG. 1 may count the output frequency signal of the oscillator 200, which is a first frequency signal, and the second frequency counter 140 may count the reference frequency signal which is a second frequency signal.

Alternatively, the first frequency counter 122 illustrated in FIG. 2 may count the reference frequency signal which is a first frequency signal, and the second frequency counter 140 may count the output frequency of the oscillator 200, which is a second frequency signal.

Hereinafter, one of the output frequency signal of the oscillator 200 and the reference frequency signal applied externally is defined as a first frequency signal, and the other one is defined as a second frequency signal.

The first frequency counter 120 or 122 may count the first frequency signal by a setting value using the first frequency signal and determine at least a part of each measurement period of the first frequency signal as a count-on time of the second frequency counter 140 or 142. Here, each measurement period of the first frequency signal refers to a period in which the first frequency counter 120 or 122 counts the first frequency signal by a setting value.

In order to exclude a first time in which an output frequency varied according to the frequency control signal is stabilized during each measurement period of the first frequency signal, the first frequency counter 120 or 122 may determine a second time, excluding the first time in each measurement period, as the count-on time of the second frequency counter 140 or 142.

The first frequency counter 120 or 122 may generate a count-on signal indicating a count-on time using a specific count value of the first frequency signal and output the count-on signal to the second frequency counter 140 or 142.

The first frequency counter 120 or 122 may generate a count completion signal for each measurement period using the count result of the first frequency signal and output the count completion signal to the comparator 160 as a measurement-on signal.

The second frequency counter 140 or 142 counts the second frequency signal for the count-on time, which is indicated by the count-on signal from the first frequency counter 120 or 122, and output the count value to the comparator 160.

When the output frequency signal of the oscillator 200 is the first frequency signal, each measurement period of the first frequency signal (an output frequency signal) is varied according to the output frequency of the oscillator 200, and thus the count-on time is varied so that the count value of the second frequency signal (a reference frequency signal) may be varied.

On the other hand, when the reference frequency signal is the first frequency signal, even when each measurement period of the first frequency signal (a reference frequency signal) is constant and thus a count-on time is constant, a count value of the second frequency signal (an output frequency signal), which is counted for the count-on time according to the output frequency of the oscillator 200, may be varied.

When the measurement-on signal is supplied from the first frequency counter 120 or 122, the comparator 160 receives the count value of the second frequency signal from the second frequency counter 140 or 142, compares the count value with an upper limit value and a lower limit value, and outputs a comparison result CO1, CO2, or CO3 indicating whether the output frequency is lower, higher than, or equal to the reference frequency.

The controller 180 generates a frequency control signal for controlling (increasing, decreasing, or maintaining) the output frequency according to the comparison result CO1, CO2, or CO3 supplied from the comparator 160.

In the search mode, the comparator 160 may compares the count value of the second frequency signal with an allowable reference frequency range determined by a first reference value and a second reference value and output a comparison result, and the controller 180 may generate a first control signal for controlling an output frequency according to the comparison result from the comparator 160 and output the first control signal as the frequency control signal. The oscillator 200 may control the output frequency according to the frequency control signal from the controller 180. The second reference value may be a value that is smaller than the first reference value.

In the tracking mode, the comparator 160 may compare the count value of the second frequency signal with a third reference value and a fourth reference value and output a comparison result, and the controller 180 may generate a second control signal for finely controlling the output frequency according to the comparison result from the comparator 160, sum the second control signal with the first control signal generated in the search mode, and output the summed signal as the frequency control signal. The oscillator 200 may control the output frequency according to the frequency control signal from the controller 180. The third reference value and the fourth reference value may be values between the first reference value and the second reference value, and the fourth reference value may be a value that is smaller than the third reference value.

For example, in the search mode, when the count value of the second frequency signal is greater than the first reference value, the comparator 160 may output the comparison result CO1 indicating that the output frequency is lower or higher than the reference frequency, and the controller 180 may generate a first control signal for increasing or decreasing the output frequency. When the count value of the second frequency is less than the second reference value, the comparator 160 may output the comparison result CO2 indicating that the output frequency is higher or lower than the reference frequency, and the controller 180 may generate a first control signal for decreasing or increasing the output frequency. When the count value of the reference frequency is present between the first reference value and the second reference value, the comparator 160 may output the comparison result CO3 indicating that the output frequency is within the allowable range of the reference frequency, and the controller 180 may output a first control signal for maintaining the output frequency. The controller 180 may output the first control signal as a frequency control signal to control the output frequency of the oscillator 200.

When the comparator 160 outputs the comparison result CO3 in the search mode, the controller 180 may output a search completion signal to the comparator 160 to control the comparator 160 to operate in the tracking mode.

In the tracking mode, when the count value of the second frequency signal for the count-on time is greater than the third reference value, by using the output frequency signal and the reference frequency signal of the oscillator 200, which are adjusted through the search mode, the comparator 160 may output a comparison result indicating that the output frequency is lower or higher than the reference frequency, and the controller 180 may generate a second control signal for increasing or decreasing the output frequency. When the count value of the second frequency signal is smaller than the fourth reference value, the comparator 160 may output a comparison result indicating that the output frequency is higher or lower than the reference frequency, and the controller 180 may generate a second control signal for decreasing or increasing the output frequency. When the count value of the second frequency signal is present between the third reference value and the fourth reference value, the comparator 160 may output a comparison result indicating that the output frequency is equal to the reference frequency, and the controller 180 may generate a second control signal for maintaining a current output frequency.

Alternatively, when the number of tracking reaches a setting value, the controller 180 may generate the second control signal for maintaining the current output frequency. During the tracking mode, the controller 180 may add the generated second control signal to the first control signal and output the added control signal as a frequency control signal, thereby minutely controlling the output frequency of the oscillator 200.

When the output frequency of the oscillator 200 becomes equal to the reference frequency, the controller 180 may terminate the frequency correction mode and store the generated frequency control signal in the memory 300.

Figure 3:
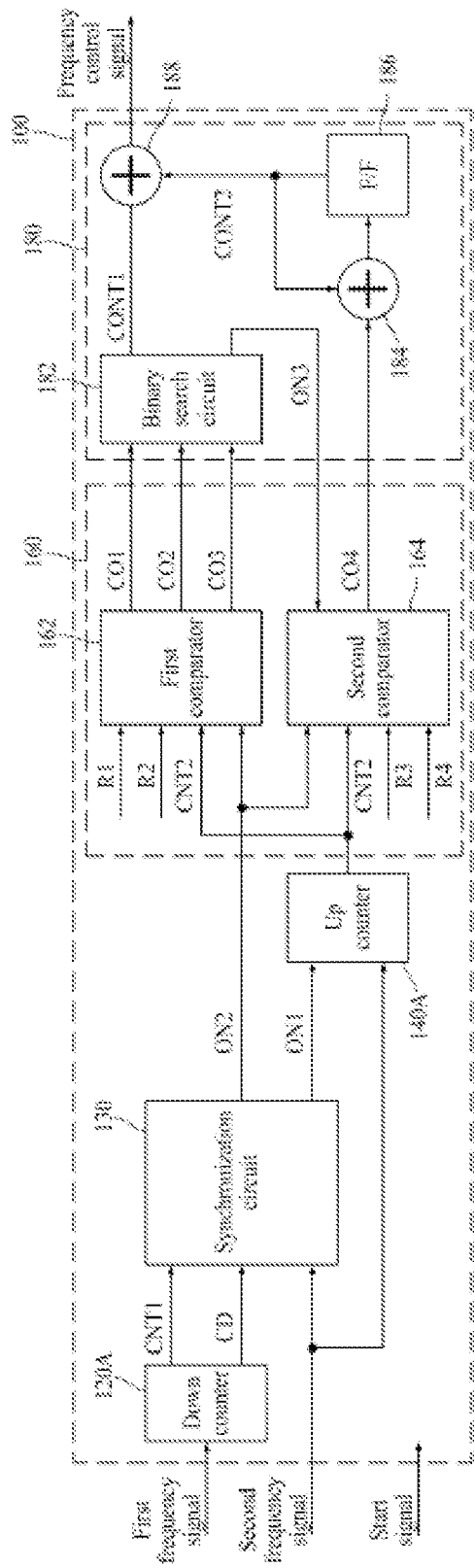
FIG. 3 is a circuit diagram illustrating an internal configuration of a frequency corrector according to one embodiment.
Figure 4:
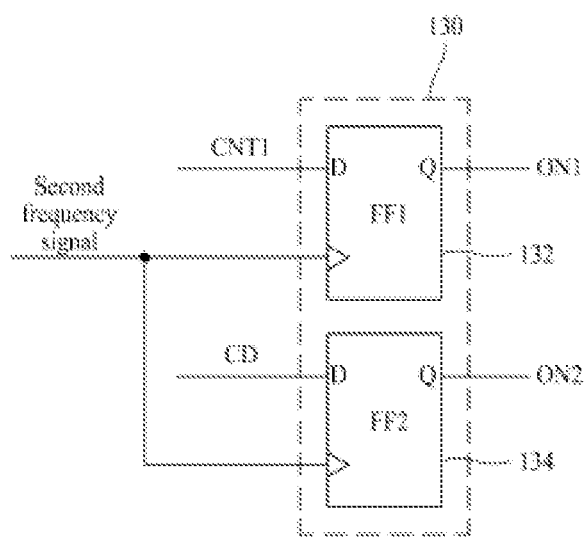
FIG. 4 is a circuit diagram illustrating an internal configuration of a synchronization circuit according to one embodiment.
Figure 5:
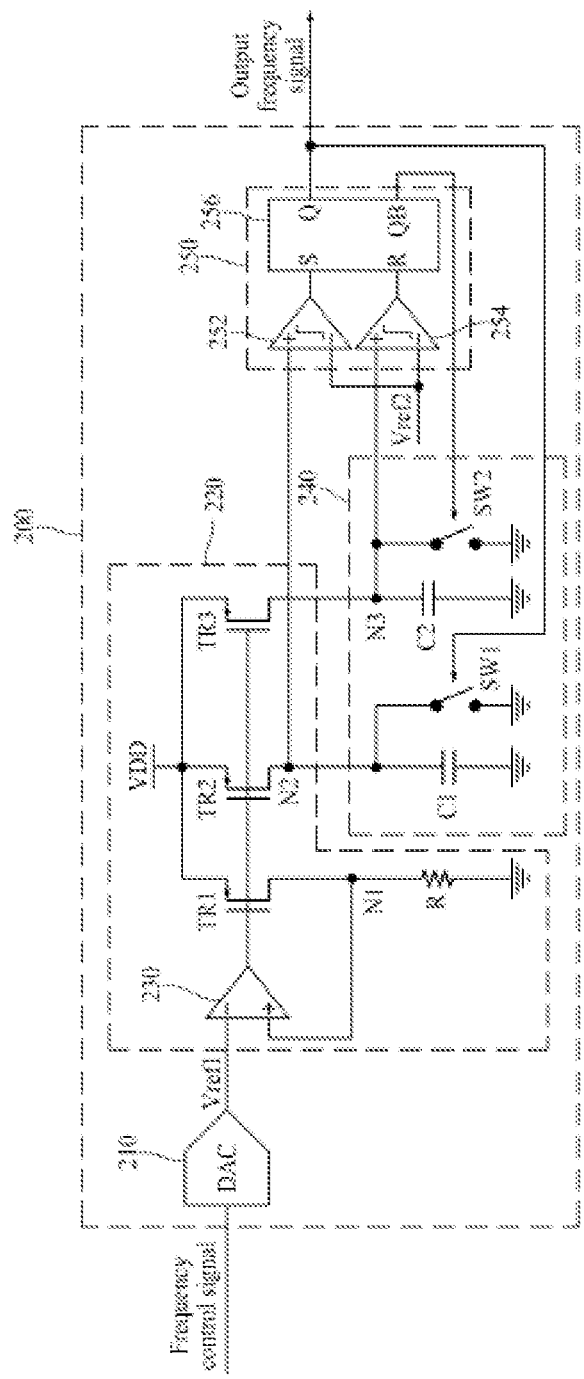
FIG. 5 is a circuit diagram illustrating an internal configuration of an oscillator according to one embodiment.

FIG. 3 is a circuit diagram illustrating an internal configuration of a frequency corrector according to one embodiment, FIG. 4 is a circuit diagram illustrating an internal configuration of a synchronization circuit according to one embodiment, and FIG. 5 is a circuit diagram illustrating an internal configuration of an oscillator according to one embodiment.

Referring to FIG. 3, the frequency corrector 100 includes a down counter 120A corresponding to the first frequency counters 120 and 122, an up counter 140A corresponding to the second frequency counters 140 and 142, and a synchronization circuit 130 connected between the down counter 120A and the up counter 140A. The frequency corrector 100 may be turned on in response to a start signal.

The down counter 120A counts down the first frequency signal from the setting value using the first frequency signal and generates a first count signal CNT1 and a count completion signal CD using the down count value to output the first count signal CNT1 and the count completion signal CD to the synchronization circuit 130. The first count signal CNT1 and the count completion signal CD are generated for each measurement period in which the down counter 120A counts down the first frequency signal from the setting value to "zero."

In each measurement period, the down counter 120A may output a first count signal CNT1 which is activated when the down count value of the first frequency signal from the setting value becomes a specific value that is smaller than the setting value, for example, half of the setting value. In each measurement period, the down counter 120A may output a count completion signal CD which is activated when the down count value of the first frequency signal from the setting value becomes "zero."

The synchronization circuit 130 synchronizes the first count signal CNT1, which is supplied from the down counter 120A, with the second frequency signal and generates an up count-on signal ON1 to output the up count-on signal ON1 to the up counter 140A. In each measurement period, in consideration of a time in which the output frequency of the oscillator 200 is varied and stabilized, a first period of the up count-on signal ON1, which is first half of each measurement period, may enter an inactive state, and a second period thereof, which is second half of each measurement period, may enter an active state to be defined as a count-on time.

The synchronization circuit 130 synchronizes the count completion signal CD, which is supplied from the down counter 120A, with the second frequency signal and generates a measurement-on signal ON2 to output the measurement-on signal ON2 to the comparator 160. In each measurement period, when the down count of down counter 120A is completed, the measurement-on signal ON2 becomes the active state.

Referring to FIG. 4, the synchronization circuit 130 may include a first D flip-flop (FF1) 132 and a second D flip-flop (FF2) 134.

The first D flip-flop 132 may output the first count signal CNT1 from the down counter 120A according to the second frequency signal, generate the up count-on signal ON1 synchronized with the second frequency signal, and output the up count-on signal ON1 to the up counter 140A.

The second D flip-flop 134 may output the count completion signal CD from the down counter 120A according to the second frequency signal, generate the measurement-on signal ON2 synchronized with the second frequency signal, and output the measurement-on signal ON2 to the comparator 160.

Referring to FIG. 3, by using the second frequency signal, the up counter 140A up-counts the second frequency signal for the count-on time in which the count-on signal ON1 supplied from the synchronization circuit 130 is activated and outputs a second frequency count value CNT2, which is the count result of the second frequency, to the comparator 160. In each measurement period, for the count-on time in which the count-on signal ON1 is in a high state, the up counter 140A may generate the second frequency count value CNT2 obtained by counting the second frequency signal and output the generated second frequency count value CNT2 to the comparator 160.

Figure 6:
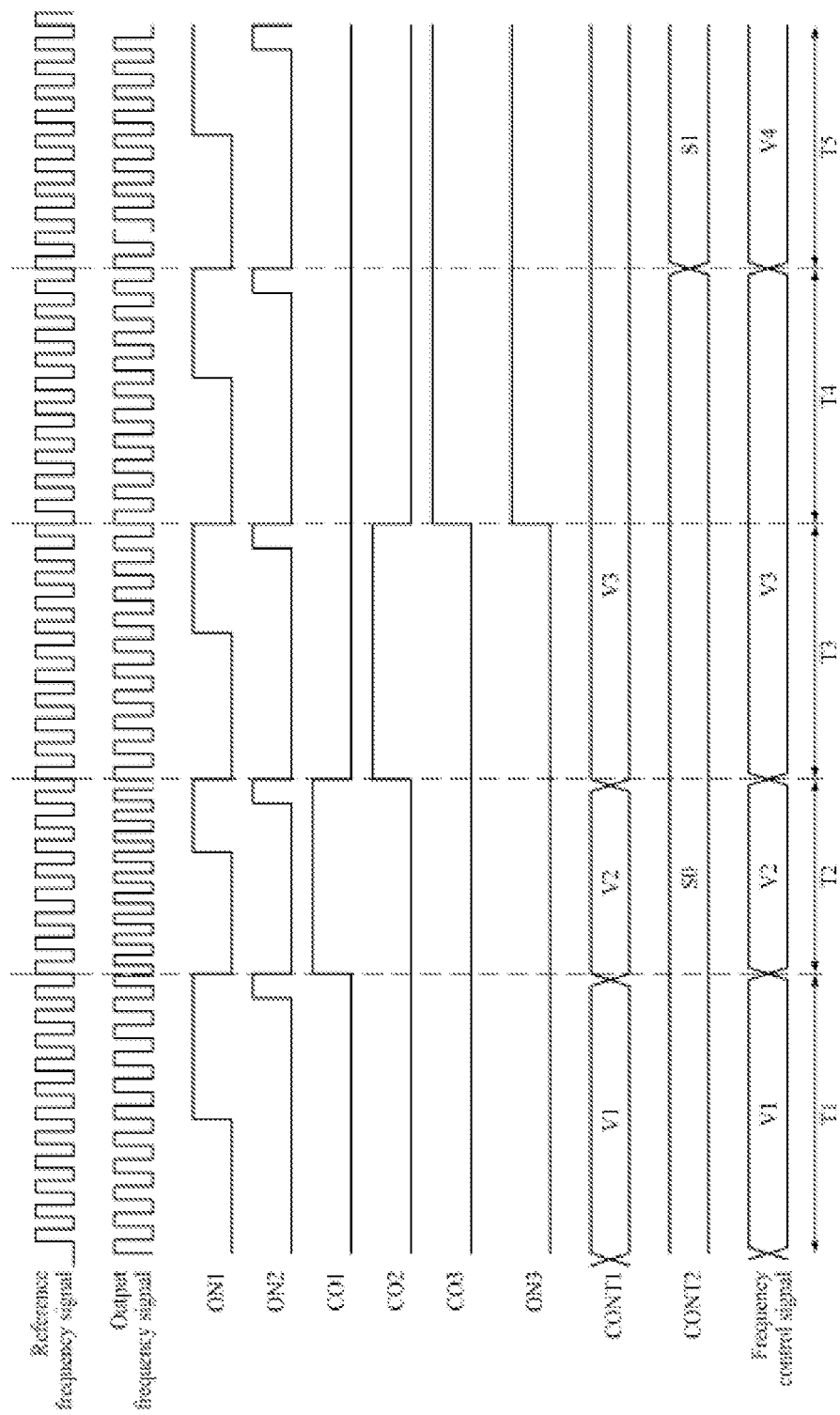
FIG. 6 is a timing diagram illustrating a frequency correction operation of the frequency generator according to one embodiment.

When the output frequency signal of the oscillator 200 is the first frequency signal, according to the output frequency of the oscillator 200, since each measurement period in which the down counter 120A counts the first frequency signal (the output frequency signal) by the setting value and the count-on time of the count-on signal ON1 according to each measurement period are varied, the second frequency count value CNT2 in which the up counter 140A counts the second frequency signal (the reference frequency signal) may be varied (see FIG. 6).

On the other hand, when the reference frequency signal is the first frequency signal, even when each measurement period in which the down counter 120A counts the first frequency signal (the (reference frequency signal) by the setting value and the count-on time according to each measurement period is constant, the second frequency count value CNT2 of the second frequency signal (the output frequency signal), which is counted by the up counter 140A according to the output frequency of the oscillator 200 for the count-on time, may be varied.

As a result, it can be seen that, according to the output frequency of the oscillator 200, the second frequency count value CNT2 of the up counter 140A corresponding to the second frequency counters 140 and 142 is varied.

When the measurement-on signal ON2 supplied from the synchronization circuit 130 enters an active state in each measurement period Tn, the comparator 160 may receive the second frequency count value CNT2 from the up counter 140A, compare the second frequency count value CNT2 with the upper limit value and the lower limit value, and output the comparison result CO1, CO2, or CO3 indicating whether the output frequency is lower, higher than, or equal to the reference frequency.

According to the comparison result CO1, CO2, or CO3 of the comparator 160 in each measurement period Tn, the controller 180 may generate and output a frequency control signal for controlling the output frequency of the oscillator 200, and the oscillator 200 may control the output frequency according to the frequency control signal from the controller 180.

The comparator 160 may include a first comparator 162 and a second comparator 164. The controller 180 may include a binary search circuit 182 and an output part. The output part may include a first adder 188, a second adder 184, and a flip-flop (FF) 186 which is a latch circuit.

When the first comparator 162 and the binary search circuit 182 operate in the search mode first, and then when the binary search circuit 182 activates a search completion signal ON3, the second comparator 164 may additionally operate in the tracking mode.

In the search mode, when the measurement-on signal ON2 from the synchronization circuit 130 is activated, the first comparator 162 may compare the second frequency count value CNT2 from the up counter 140A with a first reference value R1 and a second reference value R2 and output the comparison result CO1, CO2, or CO3. According to the comparison result CO1, CO2, or CO3 of the first comparator 162, the binary search circuit 182 of the controller 180 may perform a binary search operation and shift a binary, thereby generating the first control signal CONT1. When the first comparator 162 outputs the first comparison result CO1, the binary search circuit 182 may output a first control signal CONT1 for increasing the output frequency, and when the first comparator 162 outputs the second comparison result CO2, the binary search circuit 182 may output a first control signal CONT1 for decreasing the output frequency, and when the first comparator 162 outputs the third comparison result CO3, the binary search circuit 182 may output a first control signal CONT1 for maintaining the output frequency. The controller 180 outputs the first control signal CONT1 as a frequency control signal through the first adder 188, and the oscillator 200 controls the output frequency according to the frequency control signal from the controller 180.

When the first comparator 162 outputs the third comparison result CO3, the binary search circuit 182 may output the search completion signal ON3 in the active state to the second comparator 164, and the second comparator 164 may operate in the tracking mode.

In the tracking mode, the second comparator 164 may compare the second frequency count value CNT2 from the up counter 140A with a third reference value R3 and a fourth reference value R4 and output a comparison result CO4 (+1, 0, or −1). The output CO4 of the second comparator 164 may be output as the second control signal CONT2 through the second adder 184 and the flip-flop 186. When the second comparator 164 performs the tracking mode twice or more, the second adder 184 may add up a current output CO4($n$) of the second comparator 164 and a previous output CO4 ($n$−1) fed back from the flip-flop 186 to generate the second control signal CONT2. The first adder 188 may add up the first control signal CONT1 output from the binary search circuit 182 and the second control signal CONT2 output from the flip-flop 186 to generate the frequency control signal, and the oscillator 200 may control the output frequency according to the frequency control signal from the controller 180.

When the second comparator 164 outputs the comparison result CO4 (=0) indicating that the output frequency is equal to the reference frequency, or when the number of tracking mode becomes a setting value TH2, for example, three times, the controller 180 may terminate the frequency correction operation and store the generated frequency control signal in the memory 300.

FIG. 5 is a circuit diagram illustrating an internal configuration of an oscillator according to one embodiment.

Referring to FIG. 5, the oscillator 200 may include a reference voltage generator 210, a constant current circuit 220, a charging/discharging part 240, and an oscillation circuit 250.

The reference voltage generator 210 generates a first reference voltage Vref1 corresponding to the frequency control signal supplied from the frequency corrector 100 or the memory 300 and outputs the first reference voltage Vref1 to the constant current circuit 220. In addition, the reference voltage generator 210 may generate a second reference voltage Vref2 and output the second reference voltage Vref2 to the oscillation circuit 250.

The reference voltage generator 210 may include a digital-to-analog converter (DAC) for converting a digital code value, which corresponds to the frequency control signal, into the first reference voltage Vref1 which is an analog signal. By using a resistor string structure including a plurality of resistors connected in series between a power supply voltage and a ground voltage, the reference voltage generator 210 may generate the first reference voltage Vref1 corresponding to the frequency control signal and generate a predetermined second reference voltage Vref2.

The constant current circuit 220 generates an output current proportional to the first reference voltage Vref1 supplied from the reference voltage generator 210 and outputs the output current to the charging/discharging part 240.

The charging/discharging part 240 alternately generates a first voltage for generating a set signal S and a second voltage for generating a reset signal R using the output current generated by the constant current circuit 220 and outputs the first voltage and the second voltage to the oscillation circuit 250.

The oscillation circuit 250 generates the set signal S and the reset signal R according to a comparison result between the first voltage and the second voltage, which are supplied from the charging/discharging part 240, with the second reference voltage Vref2 and generates an output signal Q and an inverted output signal QB which oscillate according to the set signal S and the reset signal R. The output signal Q of the oscillation circuit 250 is output as a clock signal which is the output frequency signal of the oscillator 200.

Specifically, the constant current circuit 220 may include an operational amplifier 230, first to third transistors TR1, TR2, and TR3 constituting a current mirror, and a resistor R.

The operational amplifier 230 amplifies and outputs a differential voltage between the first reference voltage Vref1 supplied to an inverting terminal (−) and a feedback voltage generated at a first node N1 between a drain of the first transistor TR1 and the resistor R and supplied to a non-inverting terminal (+). The output of the operational amplifier 230 controls gates of the first to third transistors TR1, TR2, and TR3. The first to third transistors TR1, TR2, and TR3 constituting the current mirror may be p-type metal oxide semiconductor (PMOS) transistors.

The first transistor TR1 controlled by the output of the operational amplifier 230 generates a current which increases a voltage of the first node N1 to the same voltage as the first reference voltage Vref1 and outputs the current to the first node N1. The second transistor TR2 and the third transistor TR3 generate currents proportional to the current of the first transistor TR1 and output the currents to a second node N2 connected to a drain of the second transistor TR2 and a third node N3 connected to a drain of the third transistor TR3.

The charging/discharging part 240 may include a first capacitor C1 and a first switch SW1 which are connected in parallel between the second node N2 and a ground terminal of the constant current circuit 220, and a second capacitor C2 and a second switch SW2 which are connected in parallel between the third node N3 and the ground terminal of the constant current circuit 220.

The first capacitor C1 is charged due to the output current flowing from the constant current circuit 220 through the second node N2 and generates a first voltage proportional to the output current at the second node N2. The first switch SW1 is controlled by the output signal Q of the oscillation circuit 250 to charge or discharge the first capacitor C1.

The second capacitor C2 is charged due to the output current flowing from the constant current circuit 220 through the third node N3 and generates a second voltage proportional to the output current at the third node N3. The second switch SW2 is controlled by the inverted output signal QB of the oscillation circuit 250 to charge or discharge the second capacitor C2.

The first and second switches SW1 and SW2 are alternately switched to alternately charge and discharge the first and second capacitors C1 and C2.

The oscillation circuit 250 may include first and second comparators 252 and 254 and an RS flip-flop 256.

The first comparator 252 compares the first voltage, which is generated at the second node N2 between the constant current circuit 220 and the charging/discharging part 240 and supplied to the non-inverting terminal (+), with the second reference voltage Vref2 supplied to the inverting terminal (−), generates the set signal S of which a logic level is varied according to the comparison result, and outputs the set signal S to the RS flip-flop 256.

The second comparator 253 compares the second voltage, which is generated at the third node N3 between the constant current circuit 220 and the charging/discharging part 240 and supplied to the non-inverting terminal (+), with the second reference voltage Vref2 supplied to the inverting terminal (−), generates the reset signal R of which a logic level is varied according to the comparison result, and outputs the reset signal R to the RS flip-flop 256.

The RS flip-flop 256 generates the output signal Q and the inverted output signal QB which oscillate according to the set signal S and the reset signal R. The RS flip-flop 256 generates the output signal Q which alternately oscillates at a high level and a low level according to the set signal S and the reset signal R, and the inverted output signal QB of which a phase is inverted with respect to a phase of the output signal Q. The output signal Q of the RS flip-flop 256 is output as the output frequency signal of the oscillator 200. The output signal Q of the RS flip-flop 256 is supplied as a control signal of the first switch SW1, and the inverted output signal QB thereof is supplied as a control signal of the second switch SW2.

A frequency of the output frequency signal generated by the oscillator 200 is determined according to a level of the first reference voltage Vref1 corresponding to the frequency control signal. When the first reference voltage Vref1 is increased, since a charging/discharging speed of the charging/discharging part 240 is increased and thus frequencies of the set signal S and the reset signal R are increased, the oscillation circuit 250 may increase the output frequency. On the other hand, when the first reference voltage Vref1 is decreased, since the charging/discharging speed of the charging/discharging part 240 is decreased and thus the frequencies of the set signal S and the reset signal R are decreased, the oscillation circuit 250 may decrease the output frequency.

FIG. 6 is a timing diagram illustrating a frequency correction operation of the frequency generator according to one embodiment. FIG. 6 is a timing diagram illustrating a case in which, in the frequency corrector 100 shown in FIG. 3, the output frequency of the oscillator 200 is used as a first frequency signal and the reference frequency signal is used as a second frequency signal.

Referring to FIGS. 3 and 6, in each measurement period Tn (n=1, 2, 3, 4, 5) in which the down counter 120A counts the first frequency signal, which is the output frequency signal of the oscillator 200, by the setting value, the up counter 140A counts the second frequency signal, which is the reference frequency signal, for the count-on time of the count-on signal ON1, and when the count of the down counter 120A is completed, the synchronization circuit 130 outputs the measurement-on signal ON2 in an active state.

During a first measurement period T1, the controller 180 outputs a frequency control signal V1 that is equal to an initial value V1 of the first control signal CONT1 output from the binary search circuit 182, and the oscillator 200 generates and outputs an output frequency signal having an oscillation frequency corresponding to the frequency control signal V1. The first control signal V1 may be a center value of the binary search circuit 182.

When the measurement-on signal ON2 is activated during the first measurement period T1, the first comparator 162 compares the second frequency count value CNT2 supplied from the up counter 140A during the first measurement period T1 with the first reference value R1 and the second reference value R2 and outputs the comparison result CO1, CO2, or CO3 during a second measurement period T2. When the second frequency count value CNT2 is greater than the first reference value R1 during the first measurement period T1, the first comparator 162 outputs the comparison result CO1 indicating that the output frequency is lower than the reference frequency during the second measurement period T2, and the binary search circuit 182 performs a binary search operation according to the comparison result CO1 and generates the first control signal CONT1 (=V2) for increasing the output frequency. As a result, the controller 180 may output the first control signal CONT1 (=V2), which is increased during the second measurement period T2, as a frequency control signal V2, and the oscillator 200 may increase the output frequency according to the frequency control signal V2.

When the measurement-on signal ON2 is activated during the second measurement period T2, the first comparator 162 compares the second frequency count value CNT2 supplied from the up counter 140A during the second measurement period T2 with the first reference value R1 and the second reference value R2 and outputs the comparison result CO2 during the third measurement period T3. When the second frequency count value CNT2 is less than the second reference value R2 during the second measurement period T2, the first comparator 162 outputs the comparison result CO2 indicating that the output frequency is faster than the reference frequency during the third measurement period T3, and the binary search circuit 182 performs a binary search operation according to the comparison result CO2 and generates a first control signal CONT1 (=V3) for decreasing the output frequency. As a result, the controller 180 may output the first control signal CONT1 (=V3), which is increased during the third measurement period T3, as a frequency control signal V3, and the oscillator 200 may increase the output frequency according to the frequency control signal V3.

When the measurement-on signal ON2 is activated during the third measurement period T3, the first comparator 162 compares the second frequency count value CNT2 supplied from the up counter 140A during the third measurement period T3 with the first reference value R1 and the second reference value R2 and outputs the comparison result CO3 during a fourth measurement period T4. When the second frequency count value CNT2 is present between the first reference value R1 and the second reference value R2 during the third measurement period T3, the first comparator 162 outputs the comparison result CO3 indicating that the output frequency is present within a first allowable range of the reference frequency during the fourth measurement period T4. In response to the comparison result CO3 of the first comparator 162, the binary search circuit 182 outputs a search completion signal ON3 to the second comparator 164 and outputs the first control signal CONT1 (=V3) that is the same as during the previous period T3 so as to maintain the output frequency.

When a measurement-on signal ON2 is activated during the fourth measurement period T4, the second comparator 164, which is operated by a binary search completion signal BS_DONE, outputs a result CO4 (=S0, S1, or S2) obtained by comparing the second frequency count value CNT2 supplied from the up counter 140A during the fourth measurement period T4 with the third reference value R3 and the fourth reference value R4 during a fifth measurement period T5. When the second frequency count value CNT2 is greater than the third reference value R3 during the fourth measurement period T4, the second comparator 164 outputs a comparison result CO4 (=S1) indicating that the output frequency is lower than the reference frequency as the second control signal CONT2 through the second adder 184 and the flip-flop 186 during the fifth measurement period T5. The controller 180 may add the first control signal CONT1 from the binary search circuit 182 to the second control signal CONT2(=S1) (for example, S1=+1) from the flip-flop 186 and output a minutely increased frequency control signal V4 during the fifth measurement period T5, and the oscillator 200 may slightly increase the output frequency according to the frequency control signal V4.

When the measurement-on signal ON2 is activated during the fifth measurement period T5, the second comparator 164, which is operated in response to the search completion signal ON3, outputs a result CO3 (=S0, S1, or S2) obtained by comparing the second frequency count value CNT2 supplied from the up counter 140A during the fourth measurement period T4 with the third reference value R3 and the fourth reference value R4 during the next measurement period. When the reference frequency count value CNT2 during the fifth measurement period T5 is present between the third reference value R3 and the fourth reference value R4, the second comparator 164 outputs the comparison result CO3 (=S0) indicating that the output frequency is equal to the reference frequency to the second adder 184, and thus the output of the flip-flop 186 maintains the second control signal CONT2 (=S1) during the previous measurement period T5. Therefore, as the result of adding the first control signal CONT1 from the binary search circuit 182 to the second control signal CONT2 (=S1) from the flip-flop 186, the controller 180 may output the frequency control signal V4 that is the same as during the previous measurement period T5, store the frequency control signal V4 in the memory 300, and terminate the frequency correction operation.

Figure 7:
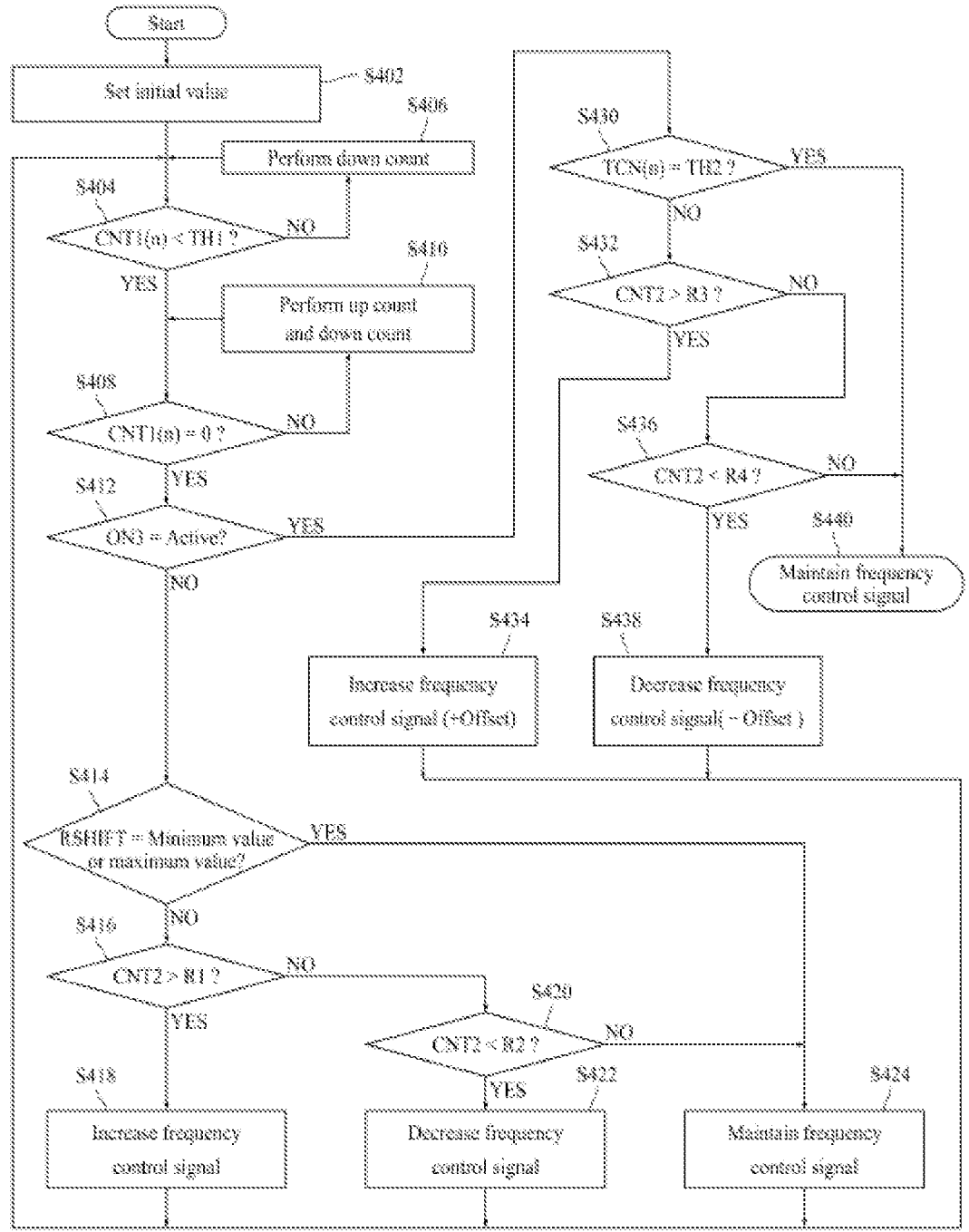
FIG. 7 is a flowchart illustrating a method of correcting a frequency of a frequency generator according to one embodiment.

FIG. 7 is a flowchart illustrating a method of correcting a frequency according to one embodiment. FIG. 7 is a flowchart illustrating a case in which, in the frequency corrector 100 shown in FIG. 3, the output frequency of the oscillator 200 is used as a first frequency signal and the reference frequency signal is used as a second frequency signal.

Referring to FIGS. 3 and 7, in response to a start signal, the frequency corrector 100 is turned on and operated to set initial values (S402). For example, the frequency corrector 100 may set a setting value CNT1(0) of the down counter 120A to D1, set a setting value CNT2(0) of the up counter 140A to U0, set a binary shift value RSHIFT(0) of the binary search circuit 182 to V1, set a tracking times count value TCNT(0) to zero, set an output of the first comparator 162 to an initial state, set an output of the second comparator 164 to an initial state T, set a frequency control signal(0) to V1, and set a search completion signal ON3 of the binary search circuit 182 to zero. RSHIFT(0) (=V1) may be a center value of the binary search circuit 182.

The down counter 120A performs a down count until the setting value CNT1(0) (=D1) becomes a specific value CNT1(n) (=TH1) (CNT1(n)=CNT1(n−1)−1) using the first frequency signal (S404 and S406).

When the down count value using the first frequency signal becomes CNT1(n)=TH1 (YES of S404), the down counter 120A performs the down count (CNT1(n)=CNT1(n−1)−1) until the down count value becomes CNT1(n)=0 (S408 and S410) and outputs an up count-on signal ON1 in an active state to the up counter 140A through the synchronization circuit 130. Accordingly, the up counter 140A performs an up count (CNT2(n+1)=CNT2(n)+1) using the second frequency signal for a count-on time of an up count-on signal ON1 (S410).

In the controller 180, when the binary search circuit 182 does not activate a search completion signal ON3 (NO of S412) and a right shift counter value RSHIFT is not shifted to a minimum value or a maximum value (NO of S414), the first comparator 162 compares a second frequency count value CNT2 from the up counter 140A with a first reference value R1 and a second reference value R2 and outputs a comparison result CO1, CO2, or CO3 to the binary search circuit 182 (S416 and S420).

When the second frequency count value CNT2 is greater than a first reference value R1 (YES of S416), the first comparator 162 outputs the comparison result CO1 indicating that the output frequency is slow, the binary search circuit 182 performs a binary search operation according to the comparison result CO1 and generates a first control signal CONT1 for increasing the output frequency, and the controller 180 outputs the first control signal CONT1 as a frequency control signal(n) during a current period. For example, the binary search circuit 182 may add a frequency control signal(n−1) during a previous period to a binary shift value RSHIFT(n) during the current period, which is shifted by one bit to a right side from a binary shift value RSHIFT(n−1) during the previous period, and generate the frequency control signal(n) for increasing the output frequency during the current period (S418).

When the second frequency count value CNT2 is less than a second reference value R2 (YES of S420), the first comparator 162 outputs the comparison result CO2 indicating that the output frequency is fast, the binary search circuit 182 performs a binary search operation according to the comparison result CO2 and generates the first control signal CONT1 for increasing the output frequency, and the controller 180 outputs the first control signal CONT1 as the frequency control signal(n) during the current period. For example, the binary search circuit 182 may perform an XOR operation on the frequency control signal(n−1) during the previous period and the binary shift counter value RSHIFT(n−1) during the previous period, add the binary shift value RSHIFT(n) during the current period, which is shifted by one bit to the right side from the binary shift value RSHIFT(n−1) during the previous period, and generate the frequency control signal(n) for decreasing the output frequency during the current period (S422).

When the second frequency count value CNT2 is present between the first reference value R1 and the second reference value R2 (NO of S416 and NO of S420), the first comparator 162 outputs the comparison result CO3 indicating that the output frequency is present within a first allowable range of the reference frequency, the controller 180 outputs the frequency control signal(n) during the current period as the same as the frequency control signal (n−1) during the previous period, and the binary search circuit 182 outputs a search completion signal ON3 in an active state to the second comparator 164 (S424).

On the other hand, when the binary shift value RSHIFT becomes the minimum value or the maximum value (YES of S414), the controller 180 may output the frequency control signal(n) during the current period as the same as the frequency control signal(n−1) during the previous period, and the binary search circuit 182 may output the search completion signal ON3 in the active state to the second comparator 164 (S424).

In operations S418, S422, and S424 in which the frequency control signal(n) is generated, the setting value of the down counter 120A is set to the initial value CNT1 (=D1), and then the procedure returns to operation S404 and repeats operation S404 to S424 in the next period to control the output frequency of the oscillator 200 to be present within an allowable range of the reference frequency.

When the binary search circuit 182 outputs the search completion signal ON3 in the active state (YES of S412), the second comparator 164 compares the second frequency count value CNT2 from the up counter 140A with the third reference value R3 and the fourth reference value R4 and outputs a comparison result CO4 (S432 and S436).

When the second frequency count value CNT2 is greater than the third reference value R3 (YES of S432), the second comparator 164 may output the comparison result CO4 (=S1) indicating that the output frequency is slow. For example, according to the comparison result CO4 indicating that the output frequency is slow, the second comparator 164 may output an increase offset value S1 (=+1). The controller 180 outputs the output S1 (=+1) of the second comparator 164 as the second control signal CONT2 through the second adder 184 and the flip-flop 186. The controller 180 may add the previous frequency control signal(n−1) corresponding to the first control signal CONT1 during the previous period to the second control signal CONT2 and generate the frequency control signal(n) for increasing the output frequency during the current period (S418).

When the second frequency count value CNT2 is less than the fourth reference value R4 (YES of S436), the second comparator 164 may output the comparison result CO4 (=S2) indicating that the output frequency is fast. For example, according to the comparison result CO4 indicating that the output frequency is fast, the second comparator 164 may output a decrease offset value S2 (=−1). The controller 180 outputs the output S2 (=−1) of the second comparator 164 as the second control signal CONT2 through the second adder 184 and the flip-flop 186. The controller 180 may add the previous frequency control signal(n−1) corresponding to the first control signal CONT1 to the second control signal CONT2 and generate the frequency control signal(n) for decreasing the output frequency during the current period.

In operations S434 and S438 in which the frequency control signal(n) is generated, the tracking times count value may be counted up (TCNT(n)=TCNT(n−1)+1), and then the setting value of the down counter 120A may be set to CNT1=D1. Then, the procedure returns to operation S404 and repeats operations S404 to S438 in the next period so that the output frequency of the oscillator 200 may be minutely controlled to be equal to the reference frequency.

When the second frequency count value CNT2 is present between the third reference value R3 and the fourth reference value R4 (S432 and NO of S436) or when the tracking times count value becomes a specific value TCNT(n) (=TH2) (YES of S430), the controller 180 outputs the frequency control signal(n) during the current period as the same as the frequency control signal(n−1) during the previous period, stores the frequency control signal(n) in the memory 300, and terminates the frequency correction operation.

Meanwhile, in the frequency corrector 100 shown in FIG. 3, when the first frequency signal is the reference frequency signal and the second frequency signal is the output frequency signal of the oscillator 200, and when the second frequency count value of CNT2 of the second frequency signal (the output frequency signal) counted by the up counter 140A is greater than the first reference value R1 or the third reference value R3, the comparator 160 outputs the comparison results CO2 and CO4 indicating that the output frequency is faster than the reference frequency so that the controller 180 may generate and output a frequency control signal for decreasing the output frequency of the oscillator 200. When the second frequency count value CNT2 is less than the second reference value R2 or the fourth reference value R4, the comparator 160 outputs the comparison results CO1 and CO4 indicating that the output frequency is lower than the reference frequency so that the controller 180 may generate and output a frequency control signal for increasing the output frequency of the oscillator 200.

As described above, the frequency generator and the method of correcting a frequency thereof according to one embodiment perform a frequency correction function through an on/off operation on a built-in frequency corrector without a frequency measuring instrument and communication therewith so that a frequency test time and a correction time for correcting the output frequency of the oscillator to be equal to the reference frequency can be shortened.

In addition, the frequency generator and the method of correcting a frequency thereof according to one embodiment sequentially perform a search mode for controlling the output frequency of the oscillator within an allowable range compared to the reference frequency and a tracking mode for minutely controlling the output frequency within the allowable range so that the frequency test time and the correction time can be shortened and the output frequency can be corrected quickly and precisely.

It will be apparent to those skilled in the art that various changes and modifications may be made without departing from the spirit and scope of the present disclosure.

In addition, at least a part of the methods described herein may be implemented using one or more computer programs or components. These components may be provided as a series of computer instructions through a computer-readable medium or a machine-readable medium, which includes volatile and non-volatile memories. The instructions may be provided as software or firmware and may be entirely or partially implemented in a hardware configuration such as application specific integrated circuits (ASICs), field programmable gate arrays (FPGAs), digital signal processors (DSPs), or other similar devices. The instructions may be configured to be executed by one or more processors or other hardware components, and when one or more processors or other hardware components execute the series of computer instructions, one or more processors or other hardware components may entirely or partially perform the methods and procedures disclosed herein.

Those skilled in the art to which the present disclosure pertains will understand that the above-described present disclosure may be embodied in other specific forms without changing the technical spirit or essential features thereof.

Therefore, it should be understood that the embodiments described above are illustrative in all respects and not restrictive. The protection scope of the present disclosure should be construed by the claims, and all technological ideas within the equivalent scope thereof should be construed as being included in the scope of rights of the present disclosure.

What is claimed is:

1. A frequency generator comprising:
   an oscillator configured to generate an output frequency signal according to a frequency control signal; and
   a frequency corrector configured to generate the frequency control signal for controlling the output frequency of the oscillator using a reference frequency signal,
   wherein, during a count-on period determined according to a first count value obtained by counting a first frequency signal which is any one of the output frequency signal of the oscillator and the reference frequency signal, the frequency corrector is configured to count a second frequency signal which is the other one of the output frequency signal and the reference frequency signal to generate a second count value and generate the frequency control signal for controlling the output frequency of the oscillator according to the second count value,
   wherein, when the frequency corrector is turned on and driven, the frequency corrector and the oscillator are configured to operate in a frequency correction mode, and the frequency corrector is configured to store the frequency control signal, which is generated through the frequency correction mode, in a memory, and
   wherein, when the frequency corrector is turned off, the oscillator is configured to operate in a normal mode for generating the output frequency signal according to the frequency control signal stored in the memory.

2. The frequency generator of claim 1, wherein the frequency corrector sequentially performs:
   a search mode for controlling the output frequency of the oscillator so as to allow the second count value to be present between a first reference value and a second reference value; and
   a tracking mode for minutely controlling the controlled output frequency of the oscillator so as to allow the second count value to be present between a third reference value and a fourth reference value.

3. The frequency generator of claim 2, wherein, in the search mode, the frequency corrector generates a first frequency control signal for increasing, decreasing, or maintaining the output frequency of the oscillator according to a result obtained by comparing the second count value, which is generated during a first count-on period using the output frequency signal of the oscillator and the reference frequency signal, with the first reference value and the second reference value.

4. The frequency generator of claim 3, wherein, in the tracking mode, the frequency corrector generates a second frequency control signal for minutely controlling the output frequency of the oscillator to be equal to the reference frequency according to a result obtained by comparing the second count value, which is generated during a second count-on period using the reference frequency signal and the output frequency signal of the oscillator generated according to the first frequency control signal, with the third reference value and the fourth reference value.

5. The frequency generator of claim 1, wherein, as the output frequency of the oscillator is controlled, each measurement period for counting the first frequency signal by a setting value, the count-on period, and the second count value are varied.

6. The frequency generator of claim 2, wherein the frequency corrector sequentially includes:
a first frequency counter configured to count the first frequency signal by a setting value and determine the count-on period using any one of the count values;
a second frequency counter configured to count the second frequency signal during the count-on period and output the second count value;
a comparator configured to compare the second count value with the first to fourth reference values and output a comparison result; and
a controller configured to generate the frequency control signal for controlling the output frequency of the oscillator according to the comparison result of the comparator.

7. The frequency generator of claim 6, wherein:
the first frequency counter includes a down counter configured to perform a down count from the setting value using the first frequency signal; and
the second frequency counter includes an up counter configured to perform an up count using the second frequency signal during the count-on period.

8. The frequency generator of claim 7, further comprising a synchronization circuit configured to synchronize an output of the down counter with the second frequency signal and output the synchronized signal,
wherein the down counter outputs an intermediate count signal using an intermediate count value among down count values, and
the synchronization circuit synchronizes the intermediate count signal with the second frequency signal, generates a count-on signal indicating the count-on period, and outputs the count-on signal to the second frequency counter.

9. The frequency generator of claim 8, wherein:
the down counter outputs a count termination signal when the down count is terminated;
the synchronization circuit synchronizes the count termination signal with the second frequency signal, generates a measurement-on signal, and outputs the measurement-on signal to the comparator; and
in response to the measurement-on signal, the comparator compares the second count value supplied from the second frequency counter with the first to fourth reference values.

10. The frequency generator of claim 6, wherein the comparator includes:
a first comparator configured to output a result obtained by comparing the second count value supplied from the second frequency counter with the first reference value and the second reference value; and
a second comparator configured to output a result obtained by comparing the second count value supplied from the second frequency counter with the third reference value and the fourth reference value.

11. The frequency generator of claim 10, wherein the controller includes:
a binary search circuit configured to perform a binary search operation according to an output of the first comparator and generate a first control signal; and
an output part configured to add the first control signal from the binary search circuit to a second control signal according to an output of the second comparator and generate the frequency control signal.

12. The frequency generator of claim 11, wherein:
in the search mode, when the first comparator outputs any one of a first comparison result and a second comparison result indicating that the second count value is greater than the first reference value or is smaller than the second reference value, the binary search circuit generates a first control signal for increasing or decreasing the output frequency;
when the first comparator outputs a third comparison result indicating that the second count value is present between the first reference value and the second reference value, the binary search circuit generates a first control signal for maintaining the output frequency;
the output part outputs the first control signal as the frequency control signal; and
when the first comparator outputs the third comparison result or when a binary shift value for a binary search operation in the binary search circuit becomes a minimum value or a maximum value, the binary search circuit outputs a search completion signal to the second comparator, thereby operating the second comparator in the tracking mode.

13. The frequency generator of claim 12, wherein:
in the tracking mode, when the second comparator outputs a comparison result indicating that the second count value is greater than the third reference value or smaller than the fourth reference value, the output part generates a second control signal for increasing or decreasing the output frequency;
when the second comparator outputs a comparison result indicating that the second count value is present between the third reference value and the fourth reference value, or when the number of tracking of the second comparator becomes a setting value, the output part generates a second control signal for maintaining the output frequency of the second comparator; and
the output part adds the first control signal supplied from the binary search circuit to the second control signal to generate the frequency control signal.

14. A method of correcting a frequency of a frequency generator, the method comprising:
a first operation of counting, by a frequency corrector, a first frequency signal which is any one of an output frequency signal of an oscillator and a reference frequency signal and determining a count-on period using any one of count values;
during the count-on period, a second operation of counting a second frequency signal which is the other one of the output frequency signal and the reference frequency signal and outputting a second count value;
a third operation of generating a frequency control signal for controlling an output frequency of the oscillator according to the second count value; and
a fourth operation of repeating the first to third operations to store the generated frequency control signal in a memory when the output frequency of the oscillator becomes equal to the reference frequency,
wherein, when the frequency corrector is turned on and driven, the frequency corrector and the oscillator operate in a frequency correction mode including the first to fourth operations, and
wherein, when the frequency corrector is turned off, the oscillator operates in a normal mode for generating the output frequency signal according to the frequency control signal stored in the memory.

15. The method of claim 14, further comprising an operation of sequentially performing a search mode for repeating the first to third operations and controlling the output frequency of the oscillator so as to allow the second count value to be present between a first reference value and a second reference value, and after the search mode, a tracking mode for repeating the first to third operations and minutely controlling the controlled output frequency of the oscillator so as to allow the second count value to be present between a third reference value and a fourth reference value.

16. The method of claim 15, wherein:
in the search mode, a first frequency control signal for increasing, decreasing, or maintaining the output frequency of the oscillator is generated according to a result obtained by comparing the second count value, which is generated during a first count-on period using the output frequency signal of the oscillator and the reference frequency signal, with the first reference value and the second reference value; and
in the tracking mode, a second frequency control signal for minutely controlling the output frequency of the oscillator to be equal to the reference frequency is generated according to a result obtained by comparing the second count value, which is generated during a second count-on period using the reference frequency signal and the output frequency signal of the oscillator generated according to the first frequency control signal, with the third reference value and the fourth reference value.

17. The method of claim 15, wherein, in the third operation of the search mode, the frequency corrector performs a binary search operation on results obtained by comparing the second count value with the first and second reference values to generate the frequency control signal for controlling the output frequency.

18. The method of claim 17, wherein:
when the second count value is present between the first reference value and the second reference value or when a binary shift value for the binary search operation becomes a minimum value or a maximum value, the frequency corrector completes the search mode and performs the tracking mode; and
when the second count value is present between the third reference value and the fourth reference value or when the number of tracking in the tracking mode becomes a setting value, the frequency corrector completes the tracking mode.

19. The method of claim 14, wherein:
in the first operation, the frequency corrector performs a down count-on the first frequency signal from a setting value and determines the count-on period using an intermediate count value among down count values;
in the second operation, the frequency corrector performs an up count-on the second frequency signal during the count-on period to output the second counter value; and
in the third operation, when the up count of the first frequency signal is completed, the frequency corrector compares the second count value with a plurality of reference values.

* * * * *